United States Patent [19]

Schulz

[11] 3,723,776

[45] Mar. 27, 1973

[54] TEMPERATURE COMPENSATED ZENER DIODE CIRCUIT

[75] Inventor: Raymond A. Schulz, Owego, N.Y.

[73] Assignee: The United States of America as represented by the Secretary of the Navy

[22] Filed: Dec. 27, 1971

[21] Appl. No.: 212,268

[52] U.S. Cl. .................................. 307/318, 307/310
[51] Int. Cl. ............................................... H03k 1/04
[58] Field of Search...307/310, 318; 317/235, 235 Q, 317/235 T

[56] References Cited

UNITED STATES PATENTS

| | | | |
|---|---|---|---|
| 3,567,965 | 3/1971 | Weinerth et al. | 317/235 Q |
| 3,400,306 | 9/1968 | Knauss | 317/235 T |
| 3,567,964 | 3/1971 | Bleher | 317/235 T |

*Primary Examiner*—John Zazworsky
*Attorney*—Richard S. Sciascia

[57] ABSTRACT

A temperature compensated zener diode circuit including a heating circuit and a pair of transistors mounted on a single monolithic integrated circuit chip with the heating circuit being electrically insulated from and thermally coupled to the transistors, base junctions of said transistors being connected in series with one reverse biased to provide a zener effect and the other forward biased to provide thermal compensation whereby the combination of heating circuit and transistor junction thermal compensation provide a zener diode circuit of improved stability and accuracy as well as adaptability to employment of present commercially available mono-lithic integrated circuits.

7 Claims, 5 Drawing Figures

TEMPERATURE COMPENSATED ZENER DIODE CIRCUIT

BACKGROUND OF THE INVENTION

The invention is in the field of semiconductor circuits. In the prior art temperature compensated zener diodes achieve at best about ± 5 ppn/C° temperature drift as precision reference voltage sources. While this is adequate for many applications, the reference voltage temperature drift becomes the limiting factor in the accuracy of high precision analog-to-digital and digital-to-analog conversion systems.

One prior art method of reducing the temperature drift of the zener voltage is to decrease the temperature range of the ambient to which the zener is exposed. This has been done in the past by placing the zener diode in a small oven. It has also been taught in the prior art to provide a degree of thermal compensation by having a transistor structure with two base emitter junctions, one operating in forward bias and the other (zener) being reverse biased, whereby the negative voltage variation with respect to temperature of the forward biased emitter base junction compensates for the positive voltage variation of the zener diode reversed bias junction.

SUMMARY OF THE INVENTION

The subject invention is directed to an integrated circuit technique for achieving an improved zener reference voltage by making use of the temperature regulation capability of monolithic integrated circuits wherein on a single monolithic integrated circuit chip there is provided two electrically isolated but thermally coupled sections, the first section being composed of two separate but well-matched transistors. The second section being composed of a temperature regulating circuit which is capable of holding the temperature of the whole monolithic chip at some constant level above the highest anticipated ambient.

One object of the invention is to provide on a single monolithic integrated circuit chip a new combination of chip temperature regulator circuit means and temperature compensating zener diode means.

DESCRIPTION OF THE PREFERRED EMBODIMENT

Figure 1:
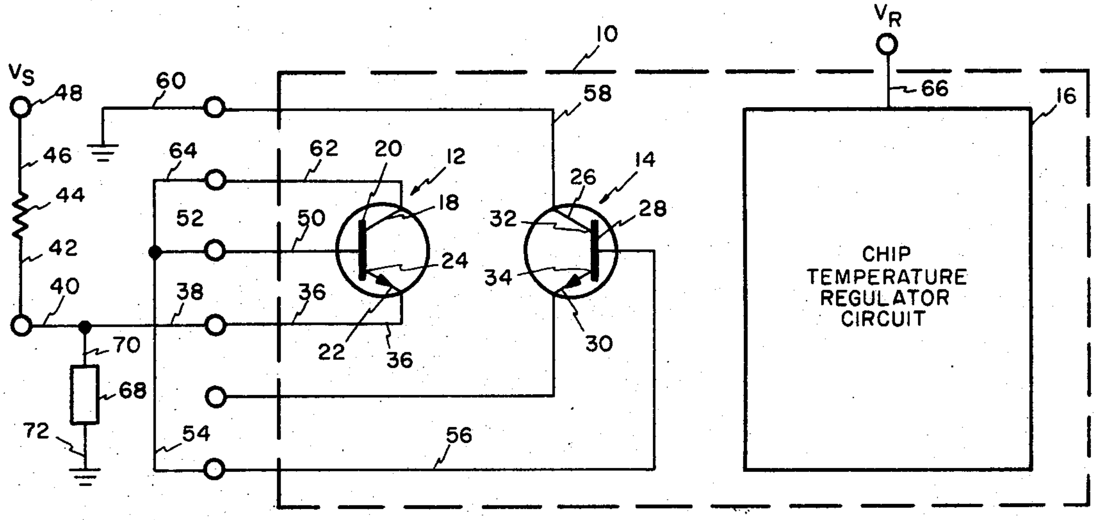
FIG. 1 is a schematic view of an integrated chip incorporating the invention including a pair of NPN transistors connected to a voltage source and to a load and a heating circuit electrically insulated from and thermally coupled to the transistors.

Referring to FIG. 1, there is provided in accordance with the invention a temperature compensating zener diode circuit comprising in combination a monolithic integrated circuit chip 10 including a pair of matched transistors 12 and 14 and a heating circuit 16 electrically insulated from and thermally coupled to said pair of transistors.

Transistor 12 includes a collector 18, base 20 and emitter 22 affording an emitter base junction 24. Transistor 14 includes a collector 26, base 28 and emitter 30 affording a collector base junction 32 and an emitter base junction 34. In FIG. 1, the emitter base junction 24 of transistor 12 is connected in reverse to provide a zener diode function and in series with a forward bias junction 32 of transistor 14 to provide a thermal compensating current whereby the combination of said thermal compensating current and said heater circuit provides a thermally stable zener diode circuit. More particularly, in FIG. 1 the emitter 22 of transistor 12 is connected by lines 36, 38, 40, 42, resistor 44 and line 46 to a voltage supply terminal indicated at 48. Current is passed from the base 20 of transistor 12 via lines 50, 52, 54 and 56 to the base 28 of transistor 14 and thence from the collector 26 of transistor 14 via lines 58 and 60 to ground (indicated). The collector 18 of transistor 12 is connected to the base 20 thereof via lines 62, 64, 52 and 50 to minimize parasitic transistor action, i.e., leakage from one junction to another, and to reduce noise. The chip temperature regulator circuit 16 is a conventional heating circuit for maintaining the chip 10 above ambient temperatures and is supplied by current via a line 66 connected to voltage supply terminal $V_R$. A load 68 is connected to the circuit via line 70, the load being connected to ground (indicated) via a line 72.

In operation, voltage from the voltage source $V_S$ is supplied to the emitter 22 of transistor 12 via lines 46, 44, 42, 40, 38, and 36. When this voltage exceeds the desired zener effect voltage to reverse breakdown the emitter base junction 24 current passes via lines 50, 52, 54, and 56 to the forward biased junction 32 of transistor 14 and thence via collector 26 and lines 58 and 60 to ground (indicated). The zener effect voltage of the emitter base junction 24 is dependent upon the doping level used during manufacture of the chip 10. The emitter base junction 24 of transistor 12 will have a positive temperature coefficient, i.e., as the temperature goes up the voltage drop goes up which is compensated for by the forward p-n base-collector junction 32 of the transistor 14.

An advantage of the above described circuit lies in the combination on a monolithic chip of heating circuit means and thermally compensating transistor junctions to produce a zener diode of improved reference voltage characteristic. A further advantage being also obtained in the commercial availability of monolithic chips intended for other purposes but providing the necessary elements and terminals such that the circuitry above described can be obtained from the commercial chip. One such monolithic chip circuit available on the market is the Fairchild linear integrated circuit identified as the $\mu$A726. The $\mu$A726 was originally intended as a temperature controlled differential amplifier input stage which is capable of very low thermally induced drift, due to the chip temperature control. However, as taught herein, it is possible to reconnect two transistors (not shown) in the $\mu$A726 (now shown), as described with respect to the matched transistors 12 and 14 of FIG. 1 to obtain the necessary temperature compensation, and thereby provide on a single monolithic integrated circuit chip a combination of chip temperature regulator circuit means and temperature compensating zener diode means.

Figure 2:
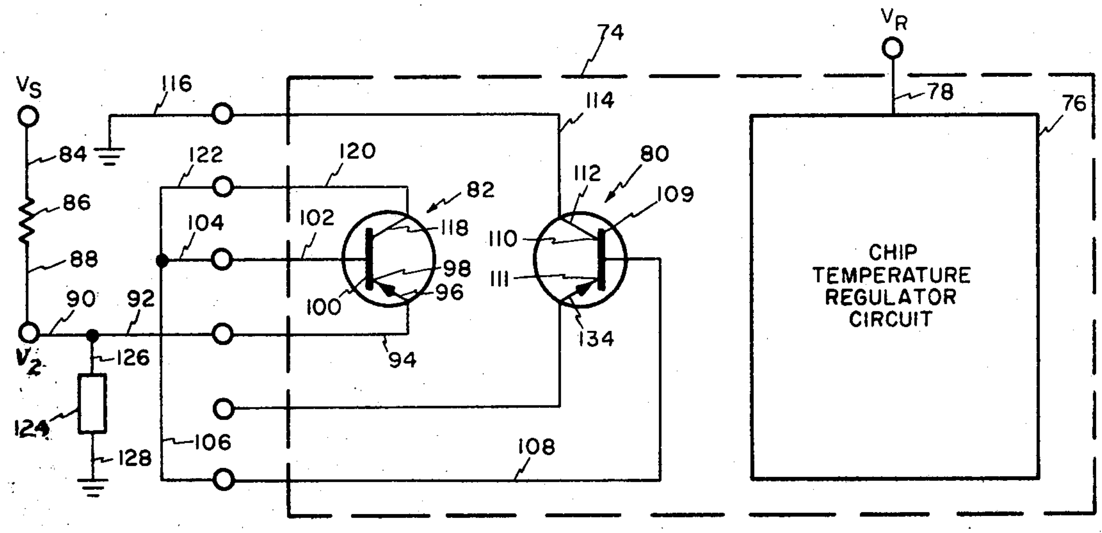
FIG. 2 is a schematic view illustrating a modification of FIG. 1 utilizing PNP transistors.

In another aspect of the subject invention it is to be noted that PNP type transistors can also be used to provide the same beneficial effect. Thus, as shown in FIG. 2, one may combine on a chip 74 a chip temperature regulator circuit 76 connected by a line 78 to a voltage source $V_R$ and two PNP transistors 80 and 82 connected to a voltage source $V_S$ with one reverse junction and one forward biased junction forming a temperature compensating zener diode circuit. In FIG. 2, when the voltage exceeds the zener effect voltage current passes from the voltage supply $V_S$ via a line 84, a resistor 86, lines 88, 90, 92, 94, the emitter 96 of transistor 82, the emitter base junction 98, base 100, lines 102, 104, 106, 108, base 109, base collector junction 110, collector 112 (of transistor 80) and lines 114 and 116 to ground (indicated). The collector 118 of transistor 82 is connected to the base thereof by lines 120, 122, 104 and 102. A load 124 is connected to line 90 by a line 126 and to a ground (indicated) by a line 128. In this arrangement the reverse breakdown in zener effect is obtained through the base-collector junction 110 of transistor 80 connected in series with the emitter-base junction 98 of transistor 82 to provide temperature compensation.

Figure 3:
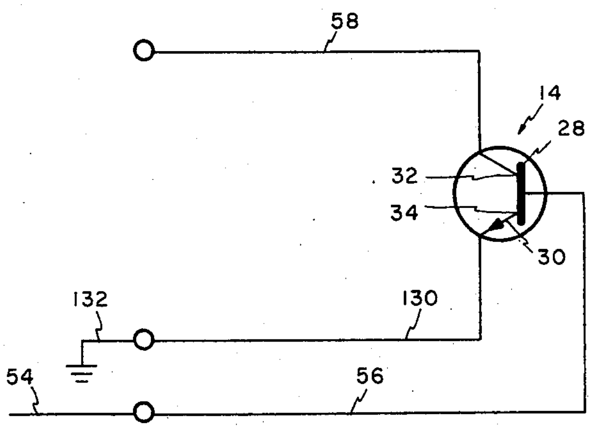
FIGS. 3 and 4 are partial circuit views illustrating respectively modifications of FIGS. 1 and 2 in the grounding junction used in the grounded transistors.
Figure 4:
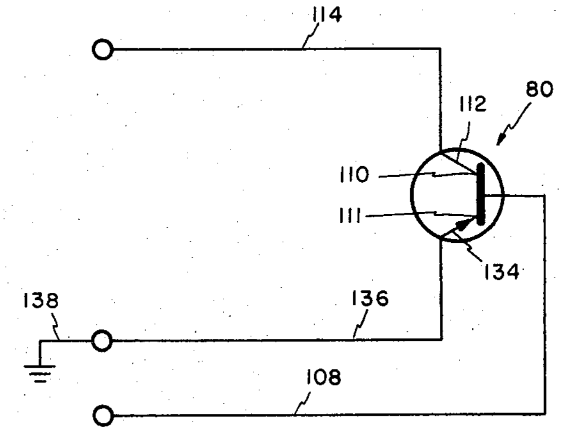

Referring to FIG. 1, it is to be understood that the base emitter junction 34 of transistor 14 may be connected to ground in place of the base collector junction 32. This is shown in FIG. 3 as a partial modification of FIG. 1. The two junctions 32 and 34 provide a slightly different temperature coefficient and the selection may be made to provide the best match with the in-series connection of transistor 12. The same is true of transistor 80 of FIG. 2. That is, the base emitter junction 111 of transistor 80 may be connected to ground in place of the base collector junction 110. This is shown in FIG. 4. Thus, in FIG. 3 is shown a modification of FIG. 1 by lines 130 and 132 connecting the emitter 30 of transistor 14 to ground (indicated) and elimination of the ground from line 58. In FIG. 4 is shown a modification of FIG. 2 by lines 136 and 138 connecting the emitter 134 of transistor 80 to ground (indicated) and the elimination of the ground from line 114.

Figure 5:
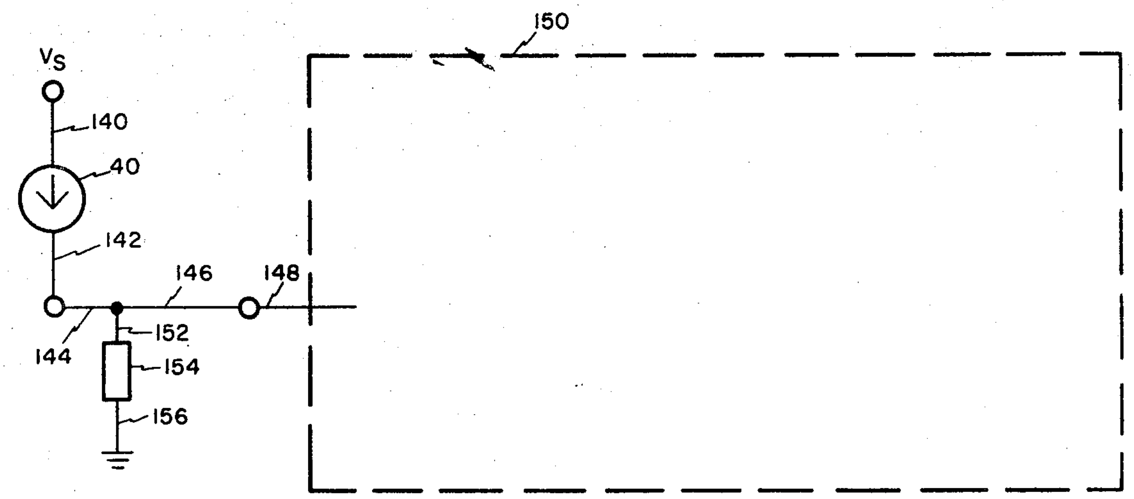
FIG. 5 illustrates the modifications of FIGS. 1 and 2 as regards the connection of the circuitry to a constant current generator in lieu of a current resistor limited voltage source.

Referring to FIG. 5, there is shown a modification of FIGS. 1 and 2 to the extent of replacing the current limiting resistors 44 and 86 respectively of FIGS. 1 and 2 with a constant current generator. Thus, in FIG. 5 a constant current generator 40 is activated from a voltage supply $V_S$ by a line 140 and passes current via lines 142, 144, 146, and 148 to the zener diode circuit 150, corresponding to chips 10 and 74 of FIGS. 1 and 2, and by lines 142, 144 and 152 to a load 154 which is connected to ground (indicated) by a line 156. For certain applications the constant current generator method of limiting current to the zener diode circuit is advantageous and provides a desirable combination of elements with reduced noise effects and a reduction in spurious voltages for which the zener diode circuit must supply corrections. In this respect the constant current generator aids in providing still more precise voltage regulation to the load.

What is claimed is:

1. A temperature compensating zener diode circuit comprising in combination a. a monolithic integrated circuit chip including a pair of notched transistors and a heating circuit electrically insulated from and thermally coupled to said pair of transistors, b. each of said transistors having an emitter base junction and a collector base junction, c. the emitter base junction of one of said transistors being connected in reverse to provide a zener diode function and in series with a forward biased junction of the other transistor to provide a thermal compensating current, whereby the combination of said thermal compensating current and said heater circuit provides a thermally stable zener diode circuit.

2. Apparatus according to claim 1, a. said matched transistors being of the NPN type, b. resistor means, the emitter of said one transistor having means for connection to a source of positive d.c. potential through said resistor means, c. the base of said one transistor being connected to the collector of said one transistor and to the base of said other transistor, d. said base-emitter junction of said other transistor being connected to ground.

3. Apparatus according to claim 1, a. said matched transistors being of the NPN type, b. resistor means, the emitter of said one transistor having means for connection to a source of positive d.c. potential through said resistor means, c. the base of said one transistor being connected to the collector of said one transistor and to the base of said other transistor, d. said collector-base junction of said other transistor being connected to ground.

4. Apparatus according to claim 1, a. said matched transistors being of the PNP type, b. resistor means, the emitter of said one transistor having means for connection to a source of negative d.c. potential through said resistor means, c. the base of said one transistor being converted to the collector of said one transistor and to the base of said other transistor, d. said collector-base junction of said other transistor being connected to ground.

5. Apparatus according to claim 1, a. said matched transistors being of the PNP type, b. resistor means, the emitter of said one transistor having means for connection to a source of negative d.c. potential through said resistor means, c. the base of said one transistor being converted to the collector of said one transistor and to the base of said other transistor, d. said base-emitter junction of said other transistor being connected to ground.

6. Apparatus according to claim 1, a. said matched transistors being of the NPN type, b. a constant current generator, the emitter of said one transistor being connected to receive the output of said constant current generator, c. the base of said one transistor being connected to the collector of said one transistor and to the base of said other transistor, d. said collector base junction of said other transistor being connected to ground.

7. Apparatus according to claim 1, a. said matched transistors being of the NPN type, b. a constant current generator, the emitter of said one transistor being connected to receive the output of said constant current generator, c. the base of said one transistor being connected to the collector of said one transistor and to the base of said other transistor, d. said base-emitter junction of said other transistor being connected to ground.

* * * * *